United States Patent [19]

Stengl et al.

[11] Patent Number: 4,823,011
[45] Date of Patent: Apr. 18, 1989

[54] ION-PROJECTION LITHOGRAPHIC APPARATUS WITH MEANS FOR ALIGNING THE MASK IMAGE WITH THE SUBSTRATE

[75] Inventors: Gerhard Stengl, Villach, Fed. Rep. of Germany; Hans Löschner, Vienna, Austria

[73] Assignee: Ionen Mikrofabrikations Systeme Gesellschaft mbH, Vienna, Austria

[21] Appl. No.: 50,978

[22] Filed: May 15, 1987

[30] Foreign Application Priority Data

May 16, 1986 [AT] Austria .................................. 1314/86

[51] Int. Cl.$^4$ ............................................ H01J 37/304
[52] U.S. Cl. ................................ 250/491.1; 250/412.2
[58] Field of Search ............. 250/491.1, 492.21, 492.2, 250/397, 398; 148/DIG. 102; 356/401

[56] References Cited

U.S. PATENT DOCUMENTS 3,928,094 12/1975 Angell ...................................... 437/8

FOREIGN PATENT DOCUMENTS

0039407 11/1981 European Pat. Off. .
53-113480 10/1978 Japan ............................... 250/491.1

Primary Examiner—Bruce C. Anderson
Assistant Examiner—Jack I. Berman

[57] ABSTRACT

An apparatus and method for the fine alignment of a mask with a substrate in ion-projection lithography, e.g. for the production of integrated circuit chips, utilizes a multipole, an axial magnetic field generator and a scale controlling projection lens in the path of the beam. The mask is provided with markings which are imaged on the substrate and brought into registry with corresponding markings thereon utilizing pairs of detectors associated with each linear marking and responsive to secondary emission of the ion-beam marking projected on the substrate. All of the markings are straight lines.

19 Claims, 3 Drawing Sheets

ION-PROJECTION LITHOGRAPHIC APPARATUS WITH MEANS FOR ALIGNING THE MASK IMAGE WITH THE SUBSTRATE

CROSS-REFERENCE TO RELATED APPLICATIONS

This application is related to our commonly owned copending applications Ser. No. 06/930,806 filed Nov. 13, 1986, now abandoned Ser. No. 06/930,805 filed Nov. 13, 1985, no U.S. Pat. No. 4,715,799, Ser. No. 06/930,812 filed Nov. 13, 1986, now U.S. Pat. No. 4,180,382, Ser. No. 06/930,807 filed Nov. 13, 1986 and Ser. No. 07/009,414 filed Jan. 30, 1987.

FIELD OF THE INVENTION

Our present invention relates to an apparatus for controlling the position of an image of the structure of a mask on a substrate for ion-projection lithography in which the mask and the substrate are provided with respective markings for mutually corresponding locations and an image of the markings of the mask is cast onto the substrate and brought into coincidence with the markings at the corresponding location of the substrate. More particularly, the invention relates to the alignment of a mask and a substrate, e.g. a wafer to be used in the fabrication of semiconductive elements and integrated circuits, in an ion-lithography projector.

The principles of ion-projection lithography in imaging a mask structure on a substrate such as silicon wafer, are well known as can be gleaned from the applications mentioned previously.

Thus it is known to provide in ion projectors for such lithographic imaging of a structure of a mask on the surface of the substrate, respective markings on the mask and on the substrate which are brought into alignment utilizing means to ensure the coincidence of the mask image with the markings on the substrate.

An ion-lithography projector for these purposes may have an electrostatic multipole disposed in an ion beam path between mask and substrate, means for generating an axial magnetic field affecting the beam and a projection lens disposed in the ion beam path and controllable by an applied voltage to vary the image reproduction scale of the image of the mask structure which is projected onto the substrate.

The image-reproduction scale of the image of the mask structure is defined as the ratio between the structure size of the mask whose image is to be projected to the size of the projected image.

For a position-correct imaging of the structure of the mask on the substrate, generally referred to as alignment, especially severe standards and requirements must apply, since the precision must be at most 10 to 20% of the smallest line width forming the image of the structure of the mask. If one is to operate with a line width of less than 0.5 $\mu$m, the precision of the alignment must lie below 0.05 and 0.1 $\mu$m. It is also important that the alignment or orientation be effected as rapidly as possible, since the alignment time does contribute significantly to the production time and hence the rate of production of integrated circuits and the like.

OBJECTS OF THE INVENTION

It is, therefore, the principal object of the present invention to provide an improved apparatus for controlling the positioning of the image of the structure of the mask on a substrate, i.e. for aligning a mask structure with an image, which eliminates drawbacks of earlier systems.

Another object of this invention is to provide an ion-lithography projector having an improved capability for ensuring registry of the image of the mask structure on a substrate as a semiconductor wafer.

It is also an object of this invention to provide an improved apparatus for the alignment of the image of a mask structure on a substrate in ion-projection lithography which can ensure the correct positioning of the image of the mask structure and the substrate rapidly, so that the production time is reduced and the production rate is increased.

SUMMARY OF THE INVENTION

These objects and others which will become apparent hereinafter are attained, in accordance with the invention, in an apparatus for controlling the positioning of the image of the structure of a mask on a substrate for ion-projection lithography in which the mask and substrate are provided with respective markings for mutually corresponding locations and an image of the markings of the mask is cast onto the substrate and brought into coincidence with the markings at the corresponding location of the substrate.

This apparatus forms part of an ion-lithography projector having an electrostatic multipole disposed in an ion-beam path between the mask and substrate, means for generating an axial magnetic field affecting the ion beam and a projection lens disposed in the ion-beam path and controllable by an applied voltage to vary the image-reproduction scale of the image of the mask structure projected onto the substrate.

According to the invention, a multiplicity of pairs of detectors for secondary radiation from the markings on the substrate are provided in a number which is divisible by two and of these detector pairs, respectively, two pairs are used to control a multipole. One pair, preferably in combination with one of the pairs controlling the multipole, is used to control the means for producing the axial magnetic field and a further pair is provided to control the projection lens either in a sense tending to enlarge the image or in a sense tending to reduce the image.

Because of the possibility to shift the image of the mask on the substrate electronically, the mechanical shifting of the support table of the substrate is limited to a coarse alignment which can have a precision of, say, 1 $\mu$m. The final and fine alignment of the image of the mask upon the substrate can then be effected without mechanical movement and extremely rapidly, so that the resulting coincidence between the images of the markings of the mask and the corresponding markings on the substrate is achieved, utilizing exclusively the detector pairs mentioned above, each of which pairs is used to act on the ion beam in a different way.

As a consequence, the time required for alignment is very short and, since the final-fine-alignment adjustment is effected in an extremely short time period, this alignment can take place during the usual exposure time at the inception of the exposure when the image of the mask may not be fully positioned precisely, without introducing significant exposure errors.

An important advantage of the invention is that the detectors can be commercial units, preferably ion-multiplier tubes or so-called channeltrons which generate control voltages which are dependent upon the number of ions captured or detected by the respective tubes.

According to another feature of the invention, each detector pair is juxtaposed with and trained upon a respective marking of the substrate, the structure markings being shaped as straight lines.

All of the aforementioned markings on the substrate are structural markings and two of these markings are aligned with one another, while a third structural line marking is at an angle thereto, preferably at a right angle.

A fourth marking is parallel to the third, but laterally offset therefrom on the substrate.

This arrangement creates a decoupling of the individual alignment movements from one another in such a manner that this arrangement creates a decoupling of the individual alignment movements from one another in such a manner that a movement in one sense, for example, a movement in the X-direction, will not affect a prior adjustment in another direction (e.g. in the Y-direction) so that practically in all directions of adjustment, a single adjustment movement is sufficient for fine alignment and any previously completed adjustment movement is not affected by an adjustment in another direction.

It has been found to be advantageous to provide the third straight-line marking so that its location lies between the two mutually aligned straight-line marking in a symmetry plane between the latter.

The markings are provided on the substrate, in accordance with another feature of the invention, in the form of zones whose emission characteristics for secondary radiation are different from those of the substrate elsewhere or generally. The straight line markings can thus be formed as local rises on the substrate formed from the material thereof. They can, however, also be in the form of metal strips.

Preferably, however, the straight-line markings are V-section grooves formed by machinery or other material-removal operations performed on the substrate.

The decoupling can be further improved in accordance with another feature of the invention, when the detectors which are trained on each straight-line marking are disposed on different sides of the respective marking outside of the effective range of particles which are derived or are emitted from other markings. This ensures that only particles from a corresponding marking will affect the detector pair associated therewith.

The possibility of utilizing the apparatus of the invention for an especially rapid alignment represents a particularly advantageous use of the process of the invention. Thus it is possible to image the complete structure of the mask including markings of the mask simultaneously on the substrate during the structure-forming exposure period with the alignment being performed simultaneously with this exposure.

On the other hand, to prevent the imaging of the complete structure of the mask on the substrate, at the brief time when the system is fine-shaped, at which time the image of the mask structure may be slightly shifted and thus leads to a minor error in the structure transferred to the substrate, we can provide a shutter which is shiftable into the beam path, i.e. by a rotating or linear shifting action.

The shutters can have an opening which can be traversed by the entire beam of radiation traversing the mask and at a distance from this opening, only elongated throughgoing slots exclusively for the radiation beam which traverse the aforementioned markings on the mask. In one position of the shutter, therefore, only the mask markings can be imaged on the substrate whereas in the other position in which the opening is in the path of the beam, the entire structure of the mask is imaged upon the substrate.

BRIEF DESCRIPTION OF THE DRAWING

The above and other objects, features and advantages of the present invention will become more readily apparent from the following description, reference being made to the accompanying, highly diagrammatic drawing in which.

SPECIFIC DESCRIPTION

Figure 1:
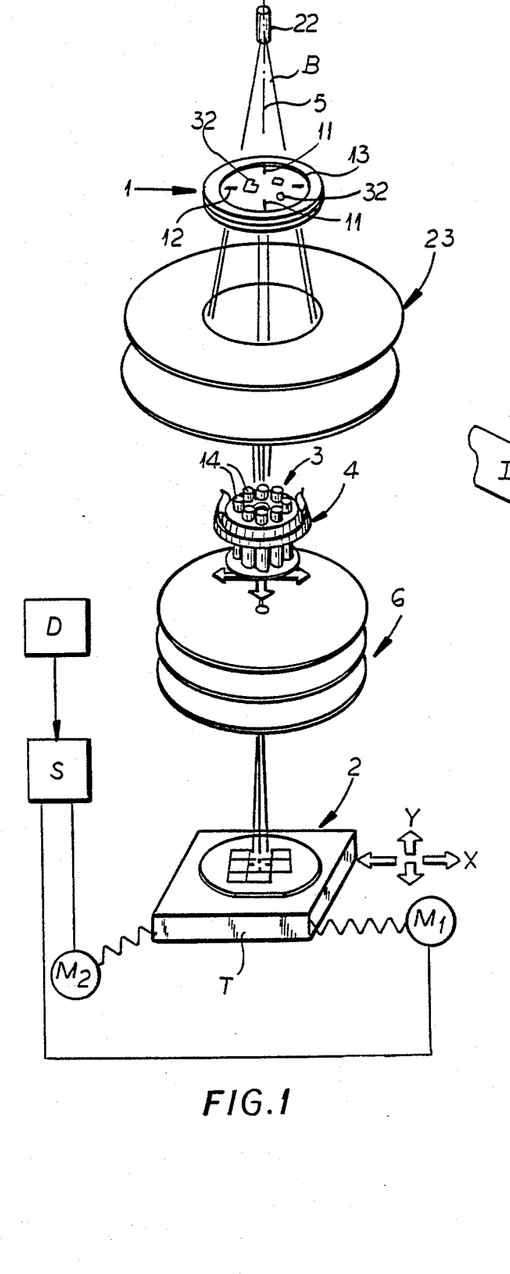
FIG. 1 is a highly diagrammatic perspective view illustrating an ion-beam projector for ion-projection lithography for the formation of semiconductor chips utilizing a mask according to the invention and illustrating in detail only the parts which are most material to the present invention, i.e. without a detailed showing of the coarse alignment means.

In FIG. 1 we have shown in extremely diagrammatic form, an ion-beam lithography projector which makes use of a mask shown generally at 1 and the structure of which is to be imaged upon a substrate 2, e.g. for the formation of chips thereon. The substrate 2 can be mounted on a table T which can be driven in the X- and Y-directions by motors $M_1$ and $M_2$ under the control of a coarse alignment control system S receiving inputs from detectors D utilizing conventional principles which are not of significance for the purposes of the present invention, except to observe the coarse positioning or alignment of the mask with respect to the substrate 2 which may be effected prior to the exposure whereas the fine alignment and fine positioning of the image of the mask structure on the substrate can be effected during exposure following the coarse alignment.

The principles of alignment are described in the aforementioned copending applications and U.S. Pat. No. 3,928,094, for example.

As noted, the present invention is directed to alignment as well and the apparatus which is described herein, can be used for the complete alignment of the structure of the mask on the substrate in the event that the coarse alignment system D, S, $M_1$, $M_2$ is not employed.

The mask 1 can be provided with markings 11–13. These markings can be traversed by an ion beam generally represented at B and generated by the ion-beam source 22 so that an image of the markings is cast upon the substrate 2.

The substrate 2 is provided with corresponding markings 16–18 (FIGS. 5–8 and 12) and utilizing the effect of the ion beam on the markings 11–13, a coincidence of the images of the markings of 11–13 of the mask 1 with the markings 16–18 on the substrate and respectively corresponding to the markings 11–13, is brought about. In the present case, however, the coincidence and alignment are effected electronically utilizing the means described in greater detail below.

The ion projector is provided in the path of the ion beam between the mask 1 and substrate 2 with an electrostatic multipole 3.

Such multipoles have been described before (see aforementioned copending applications), for example, and in the illustrated embodiment can be an octopole.

In addition, in the path we also provide a device 4 for generating a magnetic field along the optical axis. The axis of this axial field coincides with the optical axis 5.

Along the ion path, moreover, we provide a projection lens 6 of the electromagnetical type which is capable of focusing the ion beam and hence adjustable by an applied voltage or by applied voltages to vary the reproduction scale of the image reproduced on the substrate of the structure or markings of the mask. An immersion lens 23 can also be provided between mask 1 and multipole 3.

Figure 12:
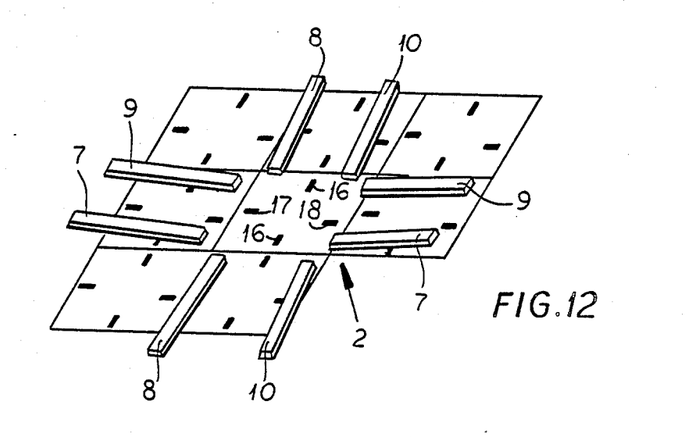
FIG. 12 is a diagram, but also in perspective form showing an arrangement of the detectors above the substrate for use in the projector arrangement of FIG. 1.

As can be seen in greater detail from FIG. 12, the projection of FIG. 1 is provided with detectors 7–10. These detectors supply, upon the projection of the images of the markings 11–13 of the mask 1 cast by the ion beam on the substrate, voltages which are generated at magnitudes determined by the secondary emission or secondary radiation emitted from the markings 16–18 of the substrate corresponding to the markings 11–13.

The detectors are provided in a number divisible by two.

In the illustrated embodiment, a total of eight detectors are provided for the secondary radiation emitted from the markings 16–18.

These eight detectors include two pair of detectors 7 and 8 serving to control the multipole 3, one pari of detectors 9 serving to control the device for generating the axial magnetic field centered on the optical axis 5, and a further pair of detectors 10 to control the projection lens.

Preferably, the pair of detectors 9 which are used to generate the axial magnetic field controls the latter conjointly with one of the pairs 8 which control the projection lens 6 so as to apply thereto a voltage for enlarging or reducing the image of the structure of the mask 1 on the substrate 2.

By corresponding control of the multipole 3, we are able electronically to deviate the beam 1 in the X- or Y-directions (FIG. 1).

Figure 9:
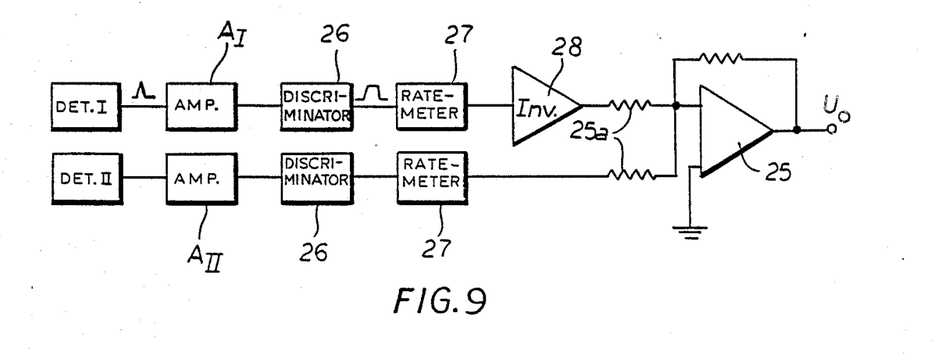
FIG. 9 is a block diagram of the control means responsive to the detectors of the invention.

All of the detectors can be commercially available ion-multiplier tubes, which generate control voltages $U_o$ with an amplitude which is dependent upon the number of ions integrated by the ion-multiplier tube utilizing appropriate electrical circuitry (FIG. 9).

Each detector pair 7–10 is juxtaposed with a straight-line marking 16–18 on the substrate which is assigned to it.

The markings are so provided that two straight-line markings 16 are aligned with one another but are spaced apart (FIGS. 5–8) while a third straight-line marking 17 lies at a right angle to the two aligned markings 16 and, more particularly, lies in a median plane of symmetry of the aligned markings 16.

A fourth straight-line marking 18 can be parallel to the third marking 17 but offset laterally therefrom (see FIGS. 5–8) on the substrate.

Figures 4, 5, 6, 7, 8:
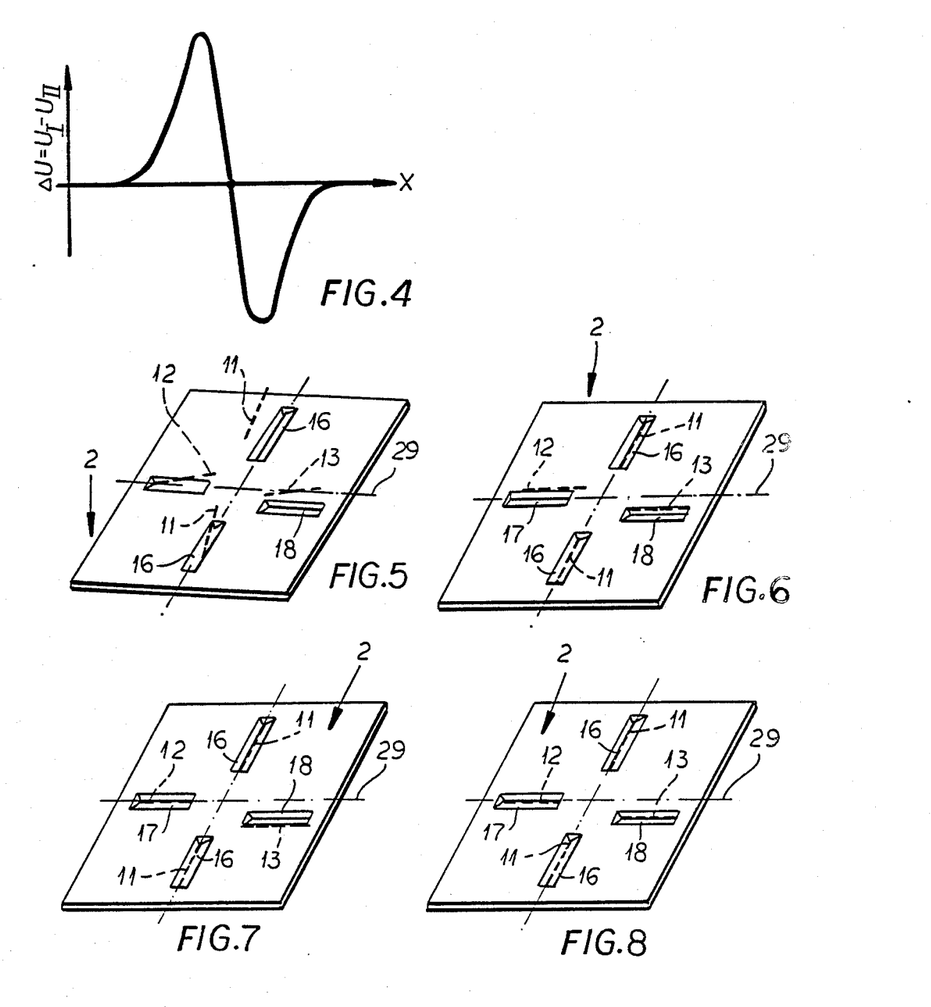
FIG. 4 is a graph illustrating the voltage difference which arises from different positions between markings on the substrate and projection of markings from the mask as diagrammatically illustrated in FIGS. 5-8.

In the embodiment illustrated in FIGS. 5–8, the marking 17 lies along a line of symmetry 29 between the two aligned markings 16 so that upon noncoincidence of the marking 16 which lies outside of the symmetry line 29 with the marking 13 of the mask, all other markings being in coincidence, coincidence between the markings 13 and 18 can be brought about exclusively by a change in scale of the image (FIGS. 7 and 8).

The arrangement of the markings 16–18 on the substrate 2 is especially clear from FIGS. 5–8 and 12. They are grooves machined into the substrate 2 which can be a silicon wafer, or some other semiconductive substance adapted to be formed into chips constituting integrated circuits represented by the structure of the mask applied thereto.

Figure 2:
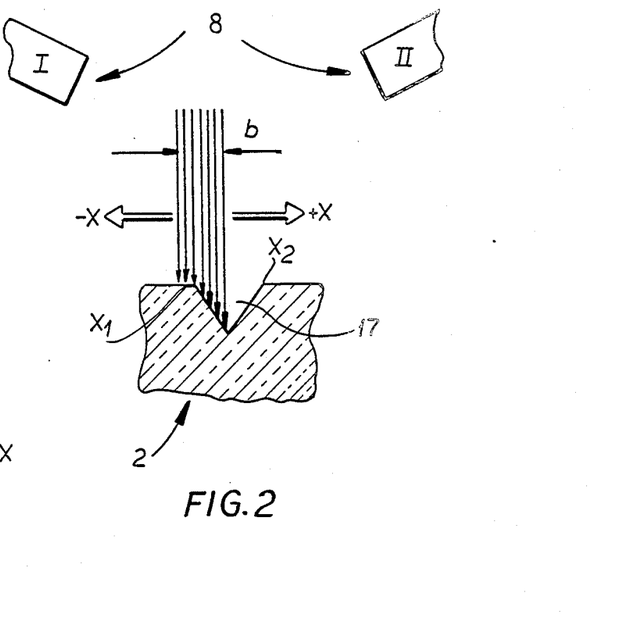
FIG. 2 is a diagram illustrating the principle by which the secondary radiation is measured from a marking on the substrate subjected to ion-beam radiation.

The grooves can have V-shaped cross sections (see especially FIG. 2).

In more general terms, however, the straight line markings 16–18 form zones of the substrate 2 whose emission capacity for secondary radiation differs from that of the substrate material itself. For example, other straight-line markings which can be used to good effect are local rises or ridges formed from the material of the substrate itself. The markings can also be formed by metal strips applied to the surface.

Figure 3:
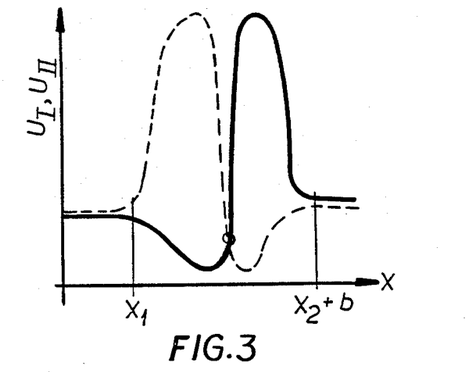
FIG. 3 is a graph illustrating the relationship between the voltage detected by the detectors and position with respect to the markings shown in FIG. 2.

FIG. 2 taken in conjunction with FIGS. 3 and 4 shows the effect when an ion-beam is projected onto the V-shaped groove forming the marking 17 in FIG. 2. The width b of the beam through the corresponding marking 11 of the mask, can be about 1 $\mu$m. The movement of the beam in the X-direction is effected by an electrostatic influence on the beam. The two detectors of the detector pair which are trained on this marking 17 have been represented at I and II. At the location $X_1$, the beam is shifted in the positive X-direction and this shift continues until the beam reaches the position $X_2 + b$.

The voltage outputted by the detectors I and II as a consequence of this beam displacement has been illustrated in FIG. 3 where the magnitude of the voltage is plotted against the ordinate against displacement along the abscissa. The voltage curve for detector II is shown in broken lines and the curve for the detector I in a continuous line.

The difference $\Delta U$ of the voltages $U_1$ and $U_2$ is visible from FIG. 4.

FIG. 9 shows how the two detectors juxtapose with a marking, for example, the marking 16 in FIG. 12 have their voltage signals transformed into a control voltage $U_o$, for example for a shift in the X-direction.

The outputs from the detectors I and II are amplified in amplifier $A_1$ and $A_2$ and then transformed in two rectangular pulses in the discriminators 26.

The outputs from the discriminators integrated in the rate meters 27 to a voltage proportional to the respective pulse detection rates and hence to the ion counts in the detector tubes.

The inverter 28 inverts the voltage signal from one of the detectors (detector I) so that the output of the latter is ultimately transformed into a negative voltage.

The operational amplifier 25 together with the resistors 25a, form an adder which, because of the presence of the inverter 28 forms a difference of the voltages generated by two detectors I and II.

The output of the operational amplifier 25 is the control voltage $U_o$, which depending on the marking from which the signal is derived can be used to control either the multipole 3, the generator of the axial magnetic field or the magnification or demagnification of the projection lens 10. Each pair of detectors is provided with a corresponding circuit between the detector pair and the electrical device which is controlled by the control voltage ultimately produced by that detection pair.

Figure 10:
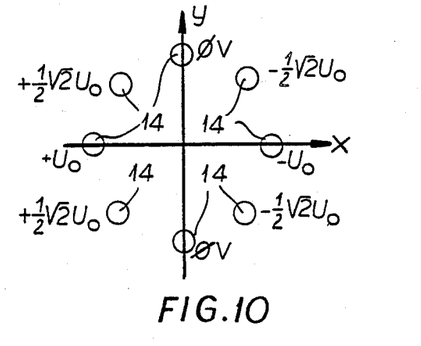
FIG. 10 is a diagram illustrating the control of the bars (voltages) of the multipole of the invention.

FIG. 10 shows, by way of example, how the voltage $U_o$ can be applied to an octopole forming the multipole 3 in a manner so as to deflect the ion beam in the X-direction. The poles of the octopole are arrayed around the optical axis of the apparatus and in FIG. 10, the Y-direction is shown perpendicular to the X-direction.

From the marking 17 in FIG. 12 and FIGS. 5–8, the respective detectors generate a signal $U_y$ which is vectorially added to $U_o$, in order to simultaneously deviate the beam in the x-y direction. The resulting vector sums are applied to the corresponding poles of the octopole in accordance with the relationship shown in FIG. 10.

Note that the pole along the X-axis to the right receives the signal $-U_o$ while the pole 14 at 180° spaced from the first-mentioned pole receives the signal $+U_o$. The poles at 14 at quadrature to these poles receive O contribution from the control voltage $U_o$ and the poles in the four quadrants receive contributions at different signs to either side of the Y-axis corresponding to 0.7071 $U_o$. A similar distribution of the vector components of the value of $U_y$ is likewise made.

Similarly to what has been described with respect to FIG. 10, the operational amplifier 25 in the circuit of the respective detectors supplies a current to the coil 4 which generates an axial magnetic field and causes rotation of the image about the axis of the ion beam. Similarly, the projection lens 6 is controlled from the output of the respective operational amplifier.

FIGS. 5–8 show how the projections of the markings 11–13 from the mask 1 may correspond to the markings 16–18 of the substrate 2. In each case, the projection of a marking is represented with a broken line, while the marking of the substrate is shown as a V-shaped groove therein.

It should be noted that each marking of the mask need not be a continuous slit, but like the broken line represented in FIGS. 5–8 may be a series of openings which are aligned with one another. Thus each image can indeed be an interrupted line.

FIG. 5 shows the positions of the marking images and the substrate markings before an electronic shift of the ion-beam projection in the X-direction is effected.

After this movement (FIG. 6), a rotation of the projected image can be effected in which the images of the markings 11 of the mask 1 coincide precisely with the median plane through the marking 16.

Then a Y-direciton shift of the projected image can be effected through the multipole (FIG. 7) without effecting the proper positioning of the images of the markings 11 on the marking 16.

After the Y-direction shift (FIG. 7), the image of the marking 12 coincides with the center of the V-shaped groove 17 of the substrate. The single marking which not yet coincides with a marking of the substrate is the marking 13 which is offset from the substrate marking 18, but is parallel thereto since the marking 18 is parallel to but offset from the marking 17.

Coincidence of the marking 13 and the marking 18 is effected by control of the projection lens and thereby variation of the magnification scale so that the overlap of the images shown in FIG. 8 will result.

From FIG. 8 and a comparison thereof with FIGS. 5–7, it will be apparent that the adjustments in the X- and Y-direction through the multipole, the rotation via the magnetic-field generator 4 and the scale change effected by the projection lens, all of the markings of the mask can be electronically brought into registry with the substrate markings so that the projected image of the mask 1 will be fully aligned with the substrate 2. Projection of the mask structure can then be effected if it had not begun during the alignment.

While the alignment steps have been described as successive, in practice it will be understood that all of the steps are generally carried out simultaneously, since all of the control circuits are decoupled from one another, i.e. are not mutually dependent. The detectors 7–10 trained on the respective straight-line markings 16–18 lie on different sides of the respective marking so that only patches emitted from the respective marking will be intercepted by the respective detectors.

During the mechanical table movement which may follow the exposure of one chip and precede the exposure of the neighboring chip, no ion beam is trained on the substrate. To this end, the shutter 19 (FIG. 11) may be used, the ion beam being blocked by the primary shutter element 30. The primary shutter element 30 may also have a window 31 allowing exposure of the entire mask. Instead of a mechanical primary shutter, we also make use of an electronic deflection of the total ion beam from impingement upon the substrate to impingement upon a baffle plate located adjacent the wafer.

Since the alignment of the mask image on the substrate 2 can be effected by deflection of the projection image and this deflection can be effected unusually rapidly, for example, in several milliseconds over a total exposure time of one second, it is possible to image the entire structure of the mask including the markings 11–13 simultaneously onto the chip even during the electronic alignment process without having noticeable signal errors in the exposure. In this case, the full intensity of the ion beam is directed against the substrate during alignment and exposure.

Figure 11:
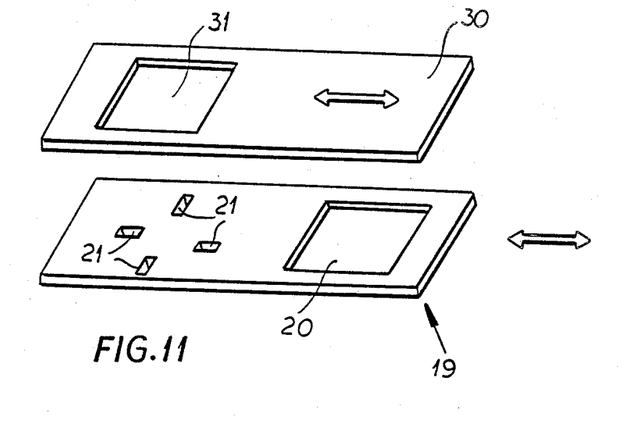
FIG. 11 is a somewhat perspective but highly diagrammatic view of a shutter arrangement, in accordance with the invention.

If this, however, proves not to be satisfactory, it is desirable to utilize the shutters of FIG. 11 so that only the markings 21 are placed in the path of the ion beam for alignment, whereupon the window 20 can be aligned with the window 31 in the path of the beam to effect the exposure.

Figure 13:
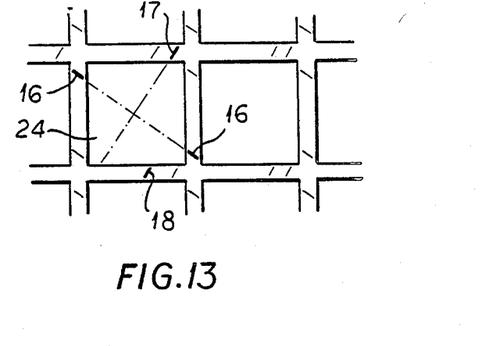
FIG. 13 is a plan view showing a different arrangement of the markings for the individual chips of the substrate in accordance with this invention.

As soon as alignment is completed, i.e. the position of the ion beam indicated in FIG. 8 is reached, the control current and voltage are maintained utilizing a hold circuit so as to stabilize the aligned positions whereupon the shutters are shifted to allow the full structure of the mask 1, namely, the working structure 32 to be image on the substrate 2. FIG. 13 shows that the markings 16–18 may be arranged in the border regions forming a chip 24, so that each marking refers to one single chip only.

We claim:

1. In an apparatus for controlling the positioning of an image of the structure of a mask on a substrate for ion-projection lithography in which the mask and the substrate are provided with respective markings for mutually corresponding locations, and an image of the markings of the mask is cast onto the substrate and brought into, coincidence with the markings at the corresponding location of the substrate, in an ion-lithography projector having:

a deflection means for deflecting said image in the plane of said substrate and disposed in an ion-beam path between said mask and said substrate, a rotation control means for rotating said image in the plane of said substrate and a scale control means for adjusting the scale of said image disposed in the ion-beam path and controllable by an applied voltage to vary the image-reproduction scale of the image of the mask structure projected onto said substrate, the improvement which comprises:

at least two pairs of spaced-apart first detectors respectively responsive to secondary radiation emitted from said markings on said substrate and operatively connected to said deflection means for controlling same;

at least a pair of spaced-apart second detectors responsive to secondary radiation emitted from said markings on said substrate and operatively connected to said rotation control means; and at least a pair of spaced-apart third detectors responsive to secondary radiation emitted from said markings on said substrate and operatively connected to said scale control means so as to control said scale control means selectively to enlarge and reduce said image of said structure on said substrate, wherein said markings on said substrate are straight lines, each of said pairs of detectors is operatively juxtaposed with a respective straight-line marking on said substrate to respond to secondary radiation therefrom, two of said straight-line markings being mutually aligned, a third of said straight-line markings being oriented at an angle to the mutually aligned straight-line markings, and a fourth of said straight-line markings being parallel to the third of said markings but laterally offset therefrom on said substrate.

2. The improvement defined in claim 1 wherein said third of said straight-line markings is at a right angle to said mutually aligned straight-line markings.

3. The improvement defined in claim 2 wherein said third of said straight-line markings is positioned between the mutually aligned straight-line markings.

4. The improvement defined in claim 1 wherein said detectors are each a respective ion-multiplier tube outputting a control voltage dependent upon detected ion numbers.

5. The improvement defined in claim 1 wherein said straight-line markings are formed as a zone with an emissive capacity for said secondary radiation which differs from that of said substrate.

6. The improvement defined in claim 1 wherein said straight-line markings are formed as local rises in the material of said substrate.

7. The improvement defined in claim 1 wherein said straight-line markings are metal strips applied to said substrate.

8. The improvement defined in claim 1 wherein said straight-line markings are grooves formed in said substrate and of V-shape cross section.

9. The improvement defined in claim 1 wherein the detectors of each pair juxtaposed with a respective one of said straight-line markings are positioned on different sides of the respective marking outside an effective range of particles emitted from another of said markings on said substrate so that each of said pairs of detectors can be assured of responding only to the particles emitted from a single respective one of said markings.

10. The improvement defined in claim 1, further comprising a shutter insertable in said path and having an opening traversed by all of the ion-beam radiation traversing said mask, and elongated throughgoing slits spaced from said opening and traversable only by radiation passing through said markings on said mask, said opening and said slits being shiftable selectively into the path so that in one position of the shutter the substrate is exposed to the ion beam only through said slits and in another position of said shutter said substrate is totally exposed to said beam through said opening.

11. The apparatus of claim 1 wherein said deflection means comprises an electrostatic multipole.

12. The apparatus of claim 1 wherein said rotation control means comprises a means for generating an axial magnetic field.

13. The apparatus of claim 1 wherein said scale control means comprises a projection lens.

14. A method, in ion-lithography projection, of controlling the positioning of an image of the structure of a mask on a substrate for ion-projection lithography in which the mask and the substrate are provided with respective markings for mutually corresponding locations, and an image of the markings of the mask is cast onto the substrate and brought into coincidence with the markings at the corresponding location of the substrate, comprising the steps of providing an ion beam projector, said projector including:

a deflection means for deflection of said image in the plane of said substrate and disposed in an ion-beam path between said mask and said substrate, a rotation control means for rotation said image in the plane of said substrate, and a scale control means disposed in the ion-beam path and controllable by an applied voltage to vary the image-reproduction scale of the image of the mask structure projected onto said substrate, said method comprising detecting said markings on said substrate with:

at least two pairs of spaced-apart first detectors respectively responsive to secondary radiation emitted from said markings on said substrate and operatively connected to said deflection means for controlling same;

at least a pair of spaced apart second detectors responsive to secondary radiation emitted from said markings on said substrate and operatively connected to said rotation control means; and at least a pair of spaced-apart third detectors responsive to secondary radiation emitted from said markings on said substrate and operatively connected to said scale control means to enlarge and reduce said image of said structure on said substrate, providing said markings on said substrate as straight lines, two of said straight-line markings being mutually aligned, a third of said straight-line markings being oriented at an angle to the mutually aligned straight-line markings, and a fourth of said straight-line markings being parallel to the third of said markings but laterally offset therefrom on said substrate and operatively disposing each of said pairs of detectors juxtaposed with a respective straight-line marking on said substrate to respond to secondary radiation therefrom to cause signals from said detectors to control the position of said image of said structure of said mask on said substrate.

15. The method of claim 14 further comprising the step of exposing simultaneously said substrate to portions of said ion beam corresponding to the structure of said mask for reproduction of said mask structure therein, and portions of said ion beam corresponding to said markings on said mask and detecting said markings on said substrate for bringing an image of the markings on said mask into coincidence therewith.

16. The method of claim 14 or 15 further comprising the steps of:

providing a shutter insertable in said path of said beam and having a first position with at least one traversed opening for passage of those portions of said beam corresponding to said markings on said mask for imaging said markings on said substrate without exposing said substrate to said image of said structure of said mask and a second position with at least one traversed opening for passage of those portions of the beam corresponding to said set of markings and said structure of said mask for imaging both said markings and said structures on said substrate, and selectively shifting said structure between said first position and said second position.

17. The method of claim 14 wherein said deflection means comprises an electrostatic multipole.

18. the method of claim 14 wherein said rotation control means comprises a means for generating an axial magnetic field.

19. The method of claim 14 wherein said scale control means comprises a projection lens.

* * * * *

UNITED STATES PATENT AND TRADEMARK OFFICE
CERTIFICATE OF CORRECTION

PATENT NO. : 4,823,011

DATED : April 18, 1989

INVENTOR(S) : Stengl et al.

It is certified that error appears in the above-identified patent and that said Letters Patent is hereby corrected as shown below:

In the Specification
Col. 5, line 52, "pari" should be --pair--.
Col. 6, line 44, "width b" should be --width $\underline{b}$-- (italicized)
Col. 7, line 9, "25a" should be --25$\underline{a}$-- (italicized)
Col. 8, line 66, "image" should be --imaged--.

In the Claims
Col. 9, line 10, delete "," after "into".

Signed and Sealed this

Second Day of January, 1990

Attest:

JEFFREY M. SAMUELS

Attesting Officer  Acting Commissioner of Patents and Trademarks